United States Patent
Scherer et al.

(10) Patent No.: US 6,952,055 B2
(45) Date of Patent: Oct. 4, 2005

(54) INTERMEDIATE STRUCTURES IN POROUS SUBSTRATES IN WHICH ELECTRICAL AND OPTICAL MICRODEVICES ARE FABRICATED AND INTERMEDIATE STRUCTURES FORMED BY THE SAME

(75) Inventors: Axel Scherer, Laguna Beach, CA (US); Theodore Doll, Arnstadt (DE); Victor Fuenzalida, Santiago (CL)

(73) Assignee: California Institute of Technology, Pasadena, CA (US)

( * ) Notice: Subject to any disclaimer, the term of this patent is extended or adjusted under 35 U.S.C. 154(b) by 271 days.

(21) Appl. No.: 09/947,089

(22) Filed: Aug. 31, 2001

(65) Prior Publication Data

US 2002/0068369 A1 Jun. 6, 2002

Related U.S. Application Data (62) Division of application No. 09/699,221, filed on Oct. 27, 2000, now Pat. No. 6,350,623.
(60) Provisional application No. 60/162,570, filed on Oct. 29, 1999.

(51) Int. Cl.[7] .......................... H01L 23/58; H01I 21/76
(52) U.S. Cl. ............................. 257/798; 257/9; 257/14; 257/29; 257/30; 438/409
(58) Field of Search ................................ 257/9, 14, 29, 257/30

(56) References Cited

U.S. PATENT DOCUMENTS

| | | | |
|---|---|---|---|
| 4,374,163 A | * | 2/1983 | Isenberg ................. 427/253 |
| 5,581,091 A | * | 12/1996 | Moskovits et al. ............. 257/9 |
| 5,670,411 A | * | 9/1997 | Yonehara et al. .......... 438/459 |
| 5,847,327 A | * | 12/1998 | Fischer et al. .............. 174/258 |
| 6,110,393 A | * | 8/2000 | Simmons et al. ............. 216/36 |
| 6,127,250 A | * | 10/2000 | Sylvester et al. ........... 438/584 |
| 6,331,493 B1 | * | 12/2001 | Sharan ...................... 438/765 |
| 6,359,288 B1 | * | 3/2002 | Ying et al. .................... 257/14 |

* cited by examiner

Primary Examiner—Amir Zarabian
Assistant Examiner—Ida M. Soward
(74) Attorney, Agent, or Firm—Daniel L. Dawes; Myers Dawes Andras & Sherman (57) ABSTRACT

The invention is a method of fabricating electrically passive components or optical elements on top or underneath of an integrated circuit by using a porous substrate that is locally filled with electrically conducting, light emitting, insulating or optically diffracting materials. The invention is directed to a method of fabricating electrically passive components like inductors, capacitors, interconnects and resistors or optical elements like light emitters, waveguides, optical switches of filters on top or underneath of an integrated circuit by using porous material layer that is locally filled with electrically conducting, light emitting, insulating or optically diffracting materials. In the illustrated embodiment the fabrication of voluminous, solenoid-type inductive elements in a porous insulating material by standard back- and front-side-lithography and contacting these two layers by electroplating micro-vias through the pores is described. By using a very dense interconnect spacing, an inter-pore capacitor structure is obtained between the metalized pores and the pore walls utilized as insulators.

18 Claims, 5 Drawing Sheets

INTERMEDIATE STRUCTURES IN POROUS SUBSTRATES IN WHICH ELECTRICAL AND OPTICAL MICRODEVICES ARE FABRICATED AND INTERMEDIATE STRUCTURES FORMED BY THE SAME

RELATED APPLICATIONS

This application is a divisional of and claims priority from U.S. patent application, Ser. No. 09/699,221, entitled "A Method Of Forming Intermediate Structures In Porous Substrates In Which Electrical And Optical Microdevices Are Fabricated And Intermediate Structures Formed By The Same", filed Oct. 27, 2000 now U.S. Pat. No. 6,350,623, which in turn was related to and claimed priority from U.S. Provisional Patent Application, Ser. No. 60/162,570, entitled Structures In Porous Substrates, filed Oct. 29, 1999.

BACKGROUND OF THE INVENTION

1. Field of the Invention

The invention relates to the field of microelectronics and in particular to the fabrication of microcircuits on porous substrates with high resolution and the structures fabricated thereby.

2. Description of the Prior Art

Interest in porous materials has mainly been because of its altered material properties in comparison to compact matter. Examples are nano- or aerogel thermal insulators or in micro devices using porous silicon membranes. Porosity may also lead to lowered dielectric constants of matter or changes in electrical resistivity. If the pores are well ordered like in anodized alumina, they could be additionally used in functional structures where the pores serve as line connections between various levels of a three dimensional structure.

Micromachining bears some problems in the case of large scale precision machining of porous matter, because the widely used technique of resist lithography does not work on porous materials. The resist is sucked into the inner pores where dissolution is later hindered or difficult to achieve. Alternative strategies which have been used to surmount this problem are methods which deposit the porous material through a hard mask, such as in metal-oxide gas sensors, or which depose the porous material on top of an already patterned resist prepared for lift off.

For those layers, which have to be made porous after depositing a bulk material, this starting layer may be structured before processing. Etching the starting material or partially covering it with an anodizing-resistant layer may do this. However, these techniques do not provide parallel pores at the edges of the porous layer, as the processes are isotropic. As a rule of thumb the width of edge disordering will be equal to the starting material thickness.

Therefore, if ordering of pores will be essentially required, the present state of the art of structuring in porous material leads to large minimum feature sizes since the isotropic porous edge region cannot be used. A new method of patterning porous material is needed which maintains pore ordering and which makes feature sizes down to the inter-pore distance possible. From this, new applications of porous layers will arise.

BRIEF SUMMARY OF THE INVENTION

The invention is a method of fabricating electrically passive components or optical elements on top or underneath of an integrated circuit by using a porous substrate that is locally filled with electrically conducting, light emitting, insulating or optically diffracting materials. The invention is directed to a method of fabricating electrically passive components like inductors, capacitors, interconnects and resistors or optical elements like light emitters, waveguides, optical switches of filters on top or underneath of an integrated circuit by using porous material layer that is locally filled with electrically conducting, light emitting, insulating or optically diffracting materials. In the illustrated embodiment the fabrication of voluminous, solenoid-type inductive elements in a porous insulating material by standard back- and front-side-lithography and contacting these two layers by electroplating micro-vias through the pores is described. By using a very dense interconnect spacing, an inter-pore capacitor structure is obtained between the metalized pores and the pore walls utilized as insulators.

The invention is a method of fabricating an intermediate structure in a porous substrate in which microdevices are fabricated and which porous substrate has a frontside with a plurality of open pores and an opposing backside wherein the plurality of pores are closed. The method comprises the steps of disposing a patterned photolithographed mask on the backside. Selected portions of the backside are removed to leave a portion of the porous substrate intact to define open pore portions and to leave a portion of the porous substrate with the backside removed to define a plurality of disconnected segments. The disconnected segments in turn define pore walls for a subplurality of doubly-opened pores which are open on each opposing end of the pore. By this means an intermediate structure is formed in which microdevices may be fabricated.

The method further comprises the step of selectively removing the plurality of disconnected segments to form a plurality of disconnected open pore substrate portions as an intermediate structure in which microdevices may be formed.

The method further comprises electroplating the backside to fill the doubly-opened pores with a filler material to define a filled pore portion and to create a starting electroplated layer on the backside.

The method further comprises further electroplating the backside to form a final electroplated layer of material thereon acting as a backing layer.

The method further comprises disposing an insulating layer on the backside prior to further electroplating the backside to form a final electroplated layer in order to reduce thickness of the final electroplated layer on the backside.

The method further comprises selectively removing open pore substrate portions to leave a filled pore portion.

The method further comprises removing the final electroplated layer on the backside to leave a free standing filled pore portion.

The method further comprises utilizing the free standing filled pore portion as an interconnect layer in a flip-chip hybrid circuit.

The method further comprises utilizing the free standing filled pore portion as a two-dimensional Zebra-connector between two surfaces bearing contact bumps which in turn are attached to connectors formed on both sides of the Zebra-connector.

The method further comprises filling in the disconnected segments with a filler material, selectively filling in the open pore portions with a conductive material and forming an array of two parallel rows of connectors through the porous substrate, and disposing metallizations on the frontside and backside of the porous substrate coupling alternate ones of the connectors in each of the two parallel rows of connectors to form a conductive coil in the porous substrate.

In one embodiment the step of filling in the disconnected segments with a filler material comprises filling in the disconnected segments with a magnetically permeable material.

The step of disposing metallizations on the frontside and backside of the porous substrate comprises disposing diagonal metallizations on the frontside and backside of the porous substrate to connect opposing connectors in the two rows.

In another embodiment the step of disposing metallizations on the frontside and backside of the porous substrate comprises disposing double metallizations which are insulated from each other so that two electrically separate coils are formed in the porous substrate.

The step of forming an array of two parallel rows of connectors through the porous substrate further comprises forming four parallel rows of connectors so that two concentric coils are formed therefrom.

The method further comprises forming a conductive contact on the frontside and backside of the porous substrate and coupling each of the conductive contacts with one end of the coil.

The method further comprises selectively removing the open pore substrate portions to leave the plurality of disconnected segments. A first conductive layer is disposed on a first end of the disconnected segments. A second conductive layer is disposed on the pore walls, on the first conductive layer exposed in the pore, and on a second end of the disconnected segments opposing the first end. An insulating layer is disposed on the second conductive layer. A third conductive layer is disposed on the insulating layer to fill the pores and to form a conductive backside layer so that a capacitor is formed.

The method further comprises electroplating a starting layer on the first end of the disconnected segments.

The step of disposing a first conductive layer on a first end of the disconnected segments comprises electroplating a conductive partial layer partially extending into the pores. disposing a seed layer within the pores and on the second end of the disconnected segments and on the conductive partial layer within the pores, and electroplating a conductive final layer on the seed layer. The conductive partial layer, seed layer and conductive final layer comprise the second conductive layer.

The step of disposing an insulating layer on the second conductive layer comprises partially converting the conductive final layer into a first insulating layer and disposing a second insulating layer thereon.

The step of disposing a third conductive layer on the insulating layer comprises disposing a second seed layer on the insulating layer and electroplating an electrode layer thereon to fill the pores and to provide the backing.

The invention is also defined as the intermediate structures and apparatus formed by the above methods. Although the methods have for the sake of grammatical ease been described in many cases as steps, it is to be expressly understood that the invention is not to be limited by the construction of means or steps based on 35 USC 112. The invention can be better visualized by turning to the following drawings wherein like elements are referenced by like numerals.

The invention and its various embodiments can now be understood in the context of the illustrated embodiments described below.

DETAILED DESCRIPTION OF THE PREFERRED EMBODIMENTS

The problem of resist being sucked into the pores is solved by the invention by uncovering a closed pore bottom layer and using photolithography for creation of the pore openings. This increases the structural resolution up to the pore ordering constant. Various applications arise from this fabrication method, ranging from the fabrication of ion masks or through contacts in for example the fabrication of micro-inductors, high volume capacitors and electroactive photonic crystal devices.

Figure 1:
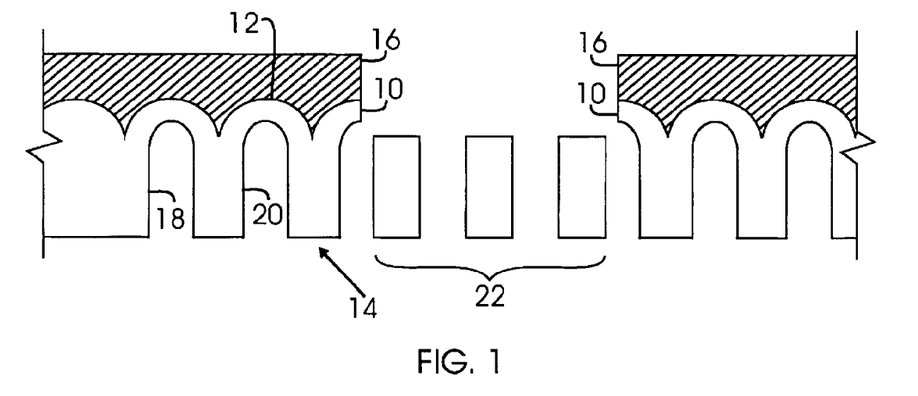
FIG. 1 is a side cross-sectional view in enlarged scale of a partially process porous substrate according to the invention.

The invention makes use of the fact that at the end of the conventional pore formation process pore endings 10 form a closed surface 12 as shown in FIG. 1. Pores 18 are formed into a substrate 14 thereby defining pore openings 20 on one surface and an opposing connected structure or pore ending 10 adjacent a back surface 12. Back side surface 12 of the porous substrate 14 is subjected to conventional patterned lithography on the reverse side, which comprises surface 12. Since resist 16 cannot seep or enter into pores 18, high spatial resolution can be achieved in resist 16. The exposed areas of pore endings 10 may now be opened by conventional etching to remove pore endings 10 and open an open pore region 22. Thus two different types of pore structures are created, having closed or open pore endings. This forms a first structure which may be further processed to entirely remove open pore regions 22, or by filling them.

Figure 2:
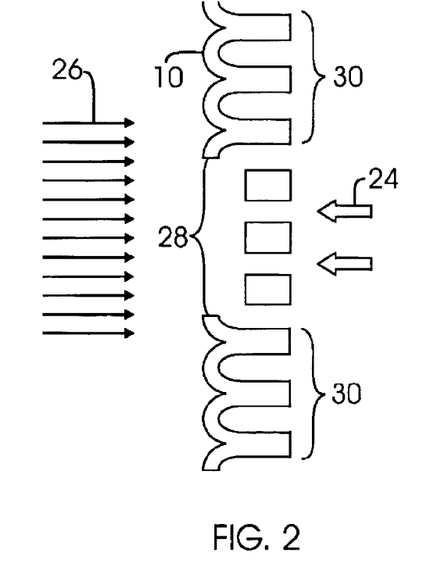
FIG. 2 is a side cross-sectional view of the porous substrate of FIG. 1 being subjected to additional process steps.
Figure 3:
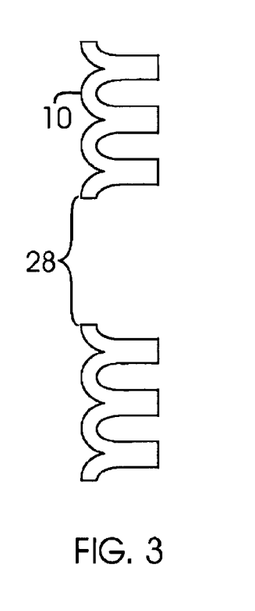
FIG. 3 is a side cross-sectional view of the porous substrate of FIGS. 1 and 2 after being completed as an intermediate structure for use in micromaching applications.

Open pore regions 22 may be entirely removed by a chemically assisted dry etch process illustrated in FIG. 2. Etchant gas, symbolically denoted by arrows 24, is provided to the open pore side of the first structure of FIG. 1 while a plasma or ion beam, symbolically denoted by arrows 26, is directed onto closed pore surface 12 after resist 16 has been removed. Reactive gas and ion beam or plasma 26 will interact on the exposed open pore region 22 in substrate opening 28. As a rule, the flux of reactive gas must be chosen to be low, as it will be completely consumed within open pore region 22 in order to avoid damage of the closed pore domes 30. The resulting structure is shown in FIG. 3 and will then have a complete and high aspect ratio opening 28.

Figure 4:
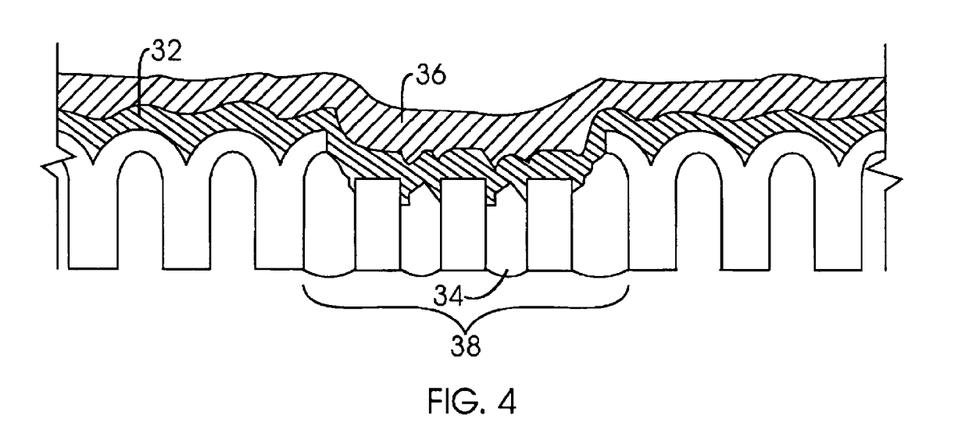
FIG. 4 is a side cross-sectional view of the porous substrate of FIG. 1 being processed to form a different intermediate structure.

In the cases where open pore region 22 is not removed, but refilled, electrochemical methods are suited for filling region 22 and opening 28 in FIG. 2. As shown in FIG. 4 after deposition of a metal starting or electroplating layer 32, electrochemical deposition of a filling material 34 may be provided, which fills open pore region 22. In order to avoid the growth of a thick backside metallization, the deposition of layer 32 laid down by a irst period of electroplating leads to almost closing of opened pore region 22. This closure or near closure allows deposition of another, insulating backside-layer 36. Collimated sputtering may be useful for pore closing as well. If the final electroplated layer (not separately shown from layer 32), which is added onto layer 32 within open pore region 22, exceeds the thickness of the first portion of layer 32, backside layer 36 may be removed by isotropic etching. If different materials are used for starting and electroplating, then their etch ratio will determine the minimum electroplating thickness needed. After this treatment the previously open pore regions 22 will be filled whereas the closed pore regions 30 be hollow, altogether forming the third basic structure as shown in FIG. 4.

Figure 5:
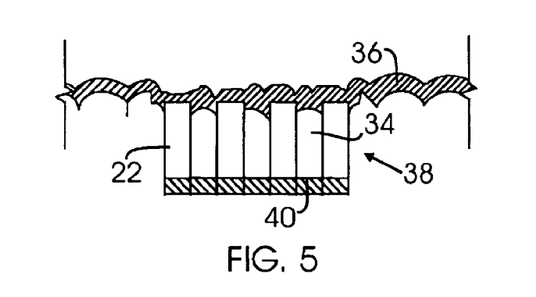
FIG. 5 is a side cross-sectional view of the porous substrate of FIG. 4 after additional process steps.

A fourth structure shown in FIG. 5 is fabricated from the structure of FIG. 4 by isotropically etching of closed pore regions 30 leaving the filled region 38 and insulating layer 36 almost remnant and removing the hollow closed-pores regions 30 as well as layer 32. Alternatively, for instance, if filling material 34 cannot withstand the latter etching, the whole front side of the structure of FIG. 4, including all open pores, is covered with an etch resistant material 40 up to an extent which yields a closed surface on top of filling material 34, but incomplete surface coverage inside hollow pores 18. Again an isotropic etch removes closed pore regions 30, and a double side opened and a filled substrate segment is derived from filled region 38 as shown in FIG. 6.

Based on these structures some novel applications can be made. For example, the structures described above may serve as highly stable mechanical ion etching masks where the structure of FIG. 3 provides pore-sized nano-patterned fields. The structures of FIG. 3 and FIG. 5 provide a high aspect ratio mechanical mask with pore-size resolution. The structure of FIG. 5 also provides a filled mask that has high mechanical stability.

Figure 6:
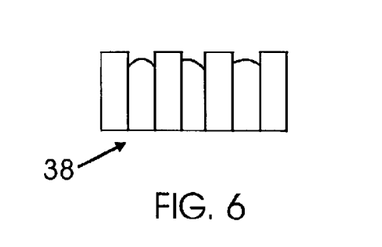
FIG. 6 is a side cross-sectional view of the porous substrate of FIG. 4 after being completed as an intermediate structure for use in micromaching applications.
Figure 7:
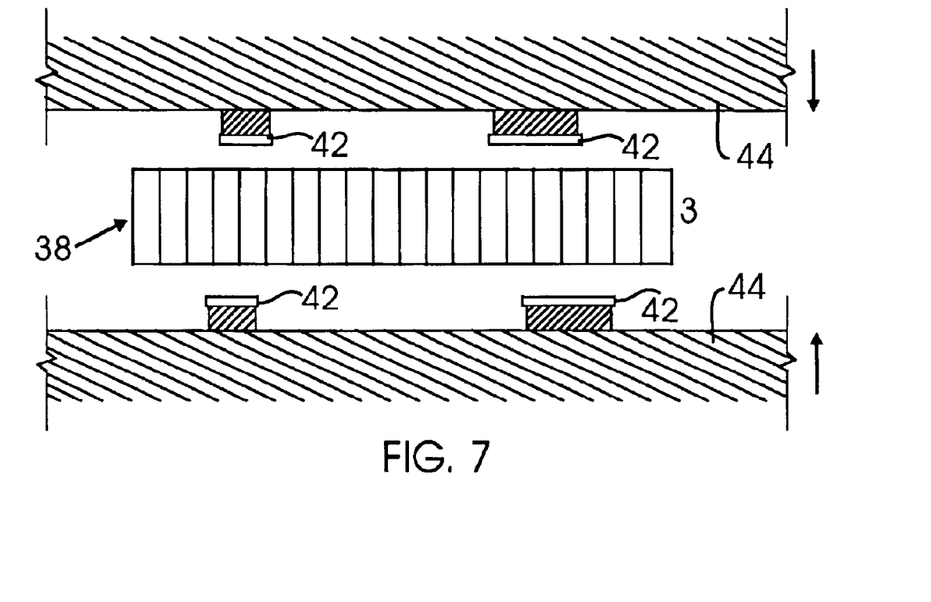
FIG. 7 is a side cross-sectional view of the intermediate structure of FIG. 6 being applied to a flip-chip hybrid.

The structure of FIG. 6 allows various through-contacts to be realized. Within the whole porous layer, comprised of insulating material, conducting areas reaching from one to the other side of the porous layer are realized. The structure of FIG. 6 derived from FIG. 4 may serve, for instance, as interconnect layer, also denoted by reference numeral 38, in a flip-chip hybrid, or in general, as a two-dimensional Zebra-connector between two surfaces bearing contact bumps 42 as shown in FIG. 7, which are attached to connectors formed on both substrates 44 of the flip-chip hybrid. With parallel, well-ordered pores defined in substrate 14, the maximum line density of the inter-pore distance can be realized. For less well ordered pore substrates, a line density of twice the maximum inter-pore distance can easily be achieved. Further corrections may be made according to pore domain tilting.

Figure 8:
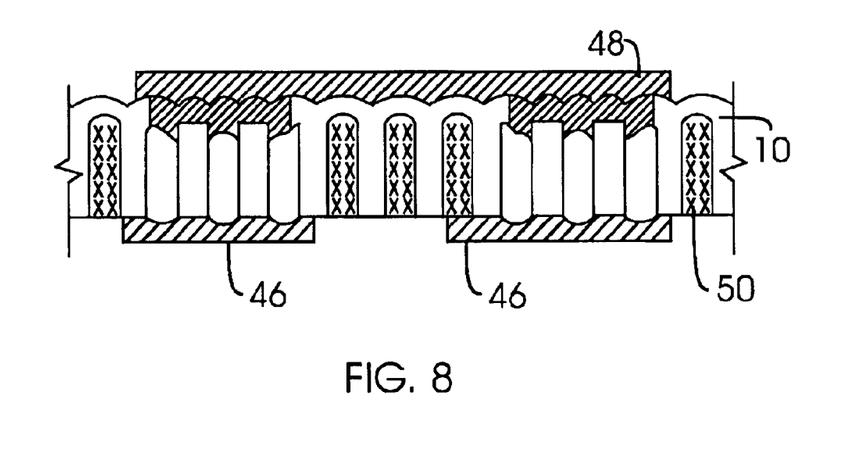
FIG. 8 is a side cross-sectional view of the intermediate structure derived from that of FIG. 1 being used as a micro-inductor.
Figure 9:
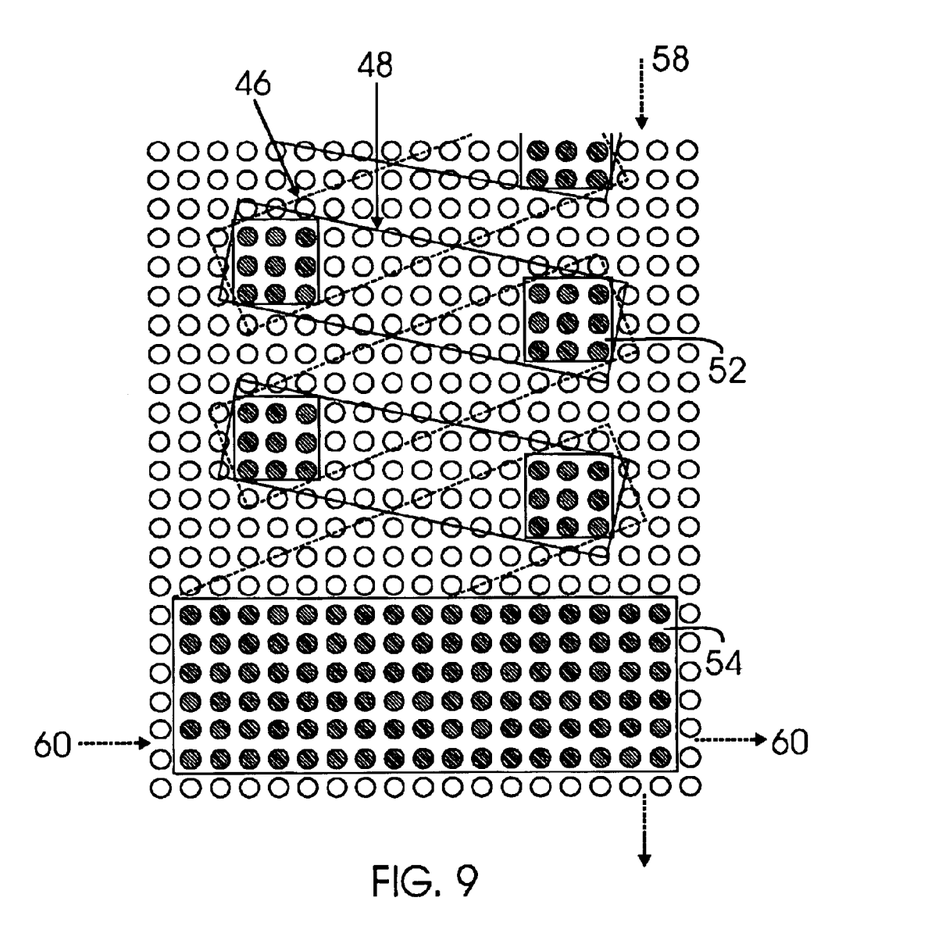
FIG. 9 is a top plan view of the micro-inductor of FIG. 8.

Another application are micro-inductors which are illustrated in FIGS. 8 and 9, e.g. of type 0201 or smaller for surface mount purposes, having long solenoid properties. Pores 18 are used to provide a plurality of parallel rows of pore interconnects 52 between the front and backside of substrate 14 on which metal stripes 46 and 48 are deposited, which stripes 46 and 48 connect two rows of micro-inductors. A plurality of such structures as depicted in FIGS. 8 and 9 are simultaneously fabricated in substrate 14. By inclining metal stripes 46 and 48 on at least one of the sides of substrate 14 which carries the two adjacent parallel rows of pore interconnects 52, a large volume coil is formed having a longitudinal axis lying in the plane of substrate 14. As stated a plurality of such coils are formed in substrate 14 at one time, although FIGS. 8 and 9 show an illustration of only one such coil.

The fabrication steps are directed to providing interconnects and backside lithography and etching of the openings for the parallel pore interconnects 52. After selectively filling interconnecting pores 18 with conductive filling material 34 by electroplating, the remaining open pores 18 at the front side of substrate 14 are filled with insulating material 50. Planarization at the front side of substrate 14 can ensure that front side lithography and stripe metallization 48 contacts pore interconnects 52, which is an array of exposed conductively filled pores 18. On the backside of substrate 14 stripes 46 can be structured by removing layer 32 and lithography followed by metallization or, by using layer 32 and etching stripes 46 from layer 32.

Figure 10:
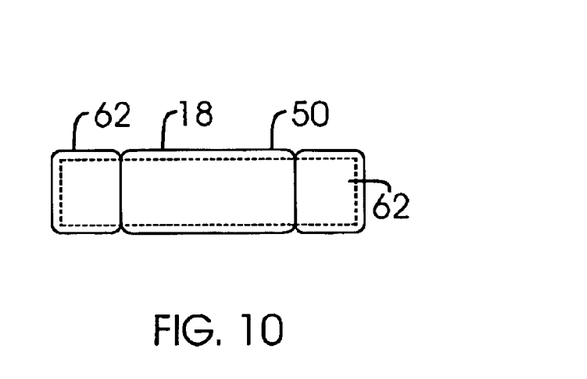
FIG. 10 is a side elevational view of the micro-inductor of FIGS. 8 and 9 after additional packaging steps.

The electrical contacts of individual coil inductors are prepared during the same steps by electroplating two rectangular fields to serve as end contacts 54 at the ends of the parallel rows of pore interconnects 52, thereby connecting to one end of the coil. After deposition of an insulating layer (not shown) over the bare coil winding comprised of stripes 46 and 48 on both the back and front side of substrate 14 as shown in FIG. 10, multiple replications of the coils of which only one is depicted in FIGS. 8 and 9, are ready for separation. A wafer saw is used for this purpose.

Simple backend processing can be achieved by designing the inductors with an insulating space between the parallel pore rows, which space is larger than the saw line 58. By this means the pore windings remain insulated from each other after sawing. End contacts 54 of two adjacent coils may be designed advantageously by lying a bit closer than the orthogonal saw lines 58 and 60 will be. This results in exposed bare metallization of end contacts 54 being made accessible after separation. After these steps the coils may undergo normal end processing like bulk solder tinning 62 of electrical contacts 54 and bulk glazing 56.

Insulative filling material 50 may be chosen advantageous by using a low dielectric, k, material or even partially leaving air within the core of the coil, i.e. in those pores 18 between the rows of pore interconnects 52. This leads to improved high frequency properties of the coils, as the dielectric losses will be reduced when compared to using the homogeneous bulk equivalent to the geometric coil structure. On the other hand, low frequency, highly inductive solenoids can be obtained by using a filling material 50 with high magnetic permeability.

Also, miniaturized transformers can be made by fabricating two coils around the same core by using double layers for stripes 46 and 48 which are insulated from each other, and corresponding double parallel rows of interconnects 52, either interlaced or concentric with each other, which are disposed on each side or around a common permeable core.

Figure 11:
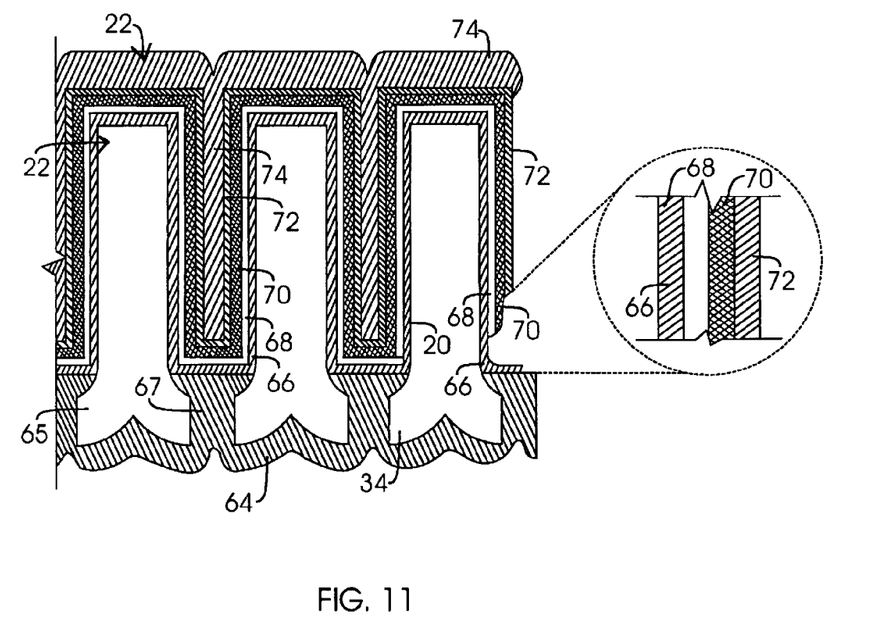
FIG. 11 is a side cross-sectional view of a microcapacitor derived from the open pore region of the intermediate structure of FIG. 1.

In addition to inductors capacitors with a high capacitance per mounting surface can be fabricated according to the invention. As shown in FIG. 11 one starts with the structure of an open pore region 22 from a substrate 14 on which a starting layer 65 is disposed in such a way to define a channel for the through contacts 67. The through contacts may be improved by partially electroplating a conductive layer 64 into pores 18. In the next step a seed layer 66 used for a subsequent electroplating step is isotropically deposited into pores 18 by means other than electroplating as well as onto the pore openings 20. A metal layer 68, such as titanium is electroplated and partially transformed into barium titanate by a hydrothermal treatment in a $Ba(OH)_2$ solution. After this the remaining, thinner titanium layer which has not been converted to barium titanate will be completely covered with a $BaTiO_3$ layer 70 which serves as a high-k insulator between the capacitor plates. Alternatively other metals may be oxidized inside pores 18 by anodization or annealing in an oxygen containing atmosphere. After deposition of another seed layer 72 a metal electrode 74 is electroplated into pore 18 filling the rest of pore 18 and the top of the once open pore region or structure 22. This finishes the capacitor's fabrication which is comprised of an interdigitated pair of metal plates 22, 65, 64, 66, 72, and 74 separated by a thin insulating layer 70.

Another application of the structure of FIG. 5 is as an active photonic crystal device which can be made by making the freestanding portions of open pore region 22 from a material having an index of refraction different to that of the porous material which comprised substrate 14. See for example, Scherer et.al., "A Method Of Electroplating Of High Aspect Ratio Metal Structures Into Semiconductors And Structures Made From The Same," U.S. Pat. No. 6,576,113, assigned to the same assignee as the present application, which is incorporated herein by reference. Incorporation of an electroluminescent or birefringent material according to the method of FIG. 6 and contacting both sides of the photonic crystal device with metallization results in an active electrooptical device.

Thus, the invention can now be understood to be a method of structuring porous layers having closed pore endings by using its backside for lithography and etch to:

1. Open the pores and entirely and selectively remove pore endings to fabricate freestanding well-ordered parallel structures as shown in FIGS. 1–10;
2. Fill the opened pores by electroplating into the pores and/or using a backside insulation layer;
3. Fill the opened pores and removing the hollow pores by isotropic etching by partial frontside deposition of an etch resistant layer to cover the filled pores but leaves the hollow pores partially uncovered, and by subsequent frontside etching;
4. Fabricate ion etch masks using the method of the invention;
5. Fabricate through contacts in a porous layer;
6. Interconnect layers for Flip-Chip hybrids;
7. Fabricate micro-inductors using porous substrates by frontside filling of the hollow (non interconnecting, plated) pores, planarizing, filling with low-k dielectric or filling with a material of high magnetic permeability, creating electroplated pores adjacent to the coil windings in preparation of front side contacts, disposing an insulating layer on top of the winding sections, using a saw line design to leave the winding side walls insulating, using a saw line design for cutting into the front side walls for bulk solder plating, and/or fabricating transformers using more than one parallel row of interconnects in porous substrates;
8. Fabricate capacitors using porous substrates by disposing bottom contacts fabricated through pore endings, electroless plating into the inner pores, hydrothermally oxidizing a metal layer in the pores, oxidizing a metal layer inside the pore using anodization, thermally oxidizing a metal layer inside the pore, and/or electroplating a metal layer into the pore to fill it.
9. Fabricate structured photonic crystal devices by filling the pores with electroluminescent/birefringent material/using plating, and/or etch mask layers as contacts (self-aligned contact)

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An apparatus serving as an intermediate structure in which microdevices are fabricated comprising a pore-filled substrate having a frontside with a plurality of nanosized open pores and an opposing backside wherein said plurality of pores are closed, selected portions of said backside being removed to leave a portion of said pore-filled substrate intact to define open pore portions and to leave a portion of said pore-filled substrate with said backside removed to define a plurality of disconnected segments which in turn define pore walls for a subplurality of doubly-opened pores which are open on each opposing end of said pore.

2. The apparatus of claim 1 where said plurality of disconnected segments are selectively removed to leave a plurality of disconnected open pore substrate portions in which said microdevices may be formed.

3. The apparatus of claim 1 further comprising an electroplated backside layer to fill said doubly-opened pores with a filler material to define a filled pore portion.

4. The apparatus of claim 3 where said open pore substrate portions are removed to leave a filled pore portion.

5. The apparatus of claim 4 where said electroplated backside layer is removed to leave a free standing filled pore portion.

6. The apparatus of claim 5 further comprising a flip-chip hybrid circuit and where said free standing filled pore portion is disposed as an interconnect layer thereto.

7. An apparatus serving as an intermediate structure in which microdevices are fabricated comprising a pore-filled substrate having a frontside with a plurality of open pores and an opposing backside wherein said plurality of pores are closed, selected portions of said backside being removed to leave a portion of said pore-filled substrate intact to define open pore portions and to leave a portion of said pore-filled substrate with said backside removed to define a plurality of disconnected segments which in turn define core walls for a subplurality of doubly-opened cores which are open on each opposing end of said pore;

an electroplated backside layer to fill said doubly-opened pores with a filler material to define a filled pore portion, where said open core substrate portions are removed to leave a filled pore portion and where said electroplated backside layer is removed to leave a free standing filled core portion; and two opposing connectors and two circuit surfaces bearing contact bumps which in turn are coupled to said connectors where said free standing filled pore portion comprises a two-dimensional Zebra-connector having two opposing sides coupled between said contact bumps.

8. The apparatus of claim 1 further comprising:

a filler material filling said doubly ended pores defined by said disconnected segments;

an array of two parallel rows of connectors through said pore-filled substrate formed by selectively filling said open pore portions with a conductive material; and metallizations on said frontside and backside of said pore-filled substrate coupling alternate ones of said connector, in each of said two parallel rows of connectors to form a conductive coil in said pore-filled substrate.

9. The apparatus of claim 8 where said filler material comprises a magnetically permeable material.

10. The apparatus of claim 8 where said metallizations on said frontside and backside of said pore-filled substrate comprise diagonal metallizations on said frontside and backside of said pore-filled substrate connected to opposing connectors in said two rows.

11. The apparatus of claim 8 where said metallizations on said frontside and backside of said pore-filled substrate comprise double metallizations which are insulated from each other so that two electrically separate coils are formed in said pore-filled substrate.

12. The apparatus of claim 8 further comprising four parallel rows of connectors so that two concentric coils are formed with said metallizations.

13. The apparatus of claim 8 further comprising a conductive contact on said frontside and backside of said pore-filled substrate coupled to each end of said coil.

14. The apparatus of claim 1 where said open pore substrate portions are selectively removed to leave said plurality of disconnected segments;

a first conductive layer on a first end of said disconnected segments;

a second conductive layer on said pore walls!, on said first conductive layer exposed in said pore, and on a second end of said disconnected segments opposing said first end;

an insulating layer on said second conductive layer;

a third conductive layer on said insulating layer to fill said pores and to form a conductive backside layer so that a capacitor is formed.

15. The apparatus of claim 14 further comprising an electroplated starting layer on said first end of said disconnected segments.

16. The apparatus of claim 14 where said first conductive layer on a first end of said disconnected segments comprises an electroplated conductive partial layer partially extending into said pores, a seed layer disposed within said pores and on said second end of said disconnected segments and on said conductive partial layer within said pores, and an electroplated conductive final layer on said seed layer, said conductive partial layer, seed layer and conductive final layer comprising said second conductive layer.

17. The apparatus of claim 14 said insulating layer on said second conductive layer comprises a portion of said conductive final layer which has been partially converted into said first insulating layer and a second insulating layer thereon.

18. The apparatus of claim 14 where said third conductive layer on said insulating layer comprises a second seed layer disposed on said insulating layer and an electroplated electrode layer disposed thereon to fill said pores and to provide said backing.

\* \* \* \* \*